United States Patent [19]

Poretti et al.

[11] 3,750,141

[45] July 31, 1973

[54] CIRCUIT ARRANGEMENT FOR THE CONTROLLED ENERGIZATION OF A LOAD

[75] Inventors: Isidoro Poretti, Castiglione Olona; Gabriele Bernasconi, Luisago, both of Italy

[73] Assignee: Societe Italiana Telecomunicazioni Siemens S. p. A., Milan, Italy

[22] Filed: Oct. 28, 1971

[21] Appl. No.: 193,438

[30] Foreign Application Priority Data

Nov. 18, 1970 Italy .............................. 31876 A/70

[52] U.S. Cl. .......................................... 340/347 DA

[51] Int. Cl. .......................................... H03k 13/04

[58] Field of Search ............... 307/254; 340/347 DA

[56] References Cited

UNITED STATES PATENTS

| | | | |
|---|---|---|---|
| 3,651,517 | 3/1972 | Kurek | 340/347 DA |
| 3,543,264 | 11/1970 | Carbrey | 340/347 DA |
| 3,541,354 | 11/1970 | Bosham | 340/347 DA |

*Primary Examiner*—Maynard R. Wilbur
*Assistant Examiner*—Jeremiah Glassman
*Attorney*—Karl F. Ross

[57] ABSTRACT

A binary-analog converter comprises a decoding matrix in the form of a ladder-type R/2R network having its several junctions connected to respective input circuits for energization by a signal representing a bit of a code word to be translated. Each input circuit includes a main transistor, continuously energized from a stabilized voltage source, and a pair of switching transistors in two parallel branches cascaded therewith, one branch leading to the associated junction point while the other one includes a dummy load of magnitude 2R/3. The two switching transistors are alternately turned on, depending upon the value of the corresponding bit.

4 Claims, 2 Drawing Figures

Isidoro PORETTI
Gabriele BERNASCONI

INVENTORS

BY Karl F. Ross

Attorney

CIRCUIT ARRANGEMENT FOR THE CONTROLLED ENERGIZATION OF A LOAD

Our present invention relates to a system for selectively energizing a load, more particularly a weighting network with several inputs to be energized independently in various combinations to generate a composite output signal.

Such a weighting network is used, for example, to decode a binary word by converting a combination of binary input signals, corresponding to the several bits thereof, into respective voltage increments of different magnitudes, related as consecutive powers of 2, whose linear superposition results in the analog equivalent of the incoming word. A conventional network of this character includes a multiplicity of ladder sections with resistive series arms of magnitude R and shunt arms of magnitude 2R forming a number of junctions separated by one or more sections from an output terminal; the voltage appearing at that terminal is, in the ideal case, the $2^k$-th part of the voltage fed in at any one of these junctions, the integer $k$ denoting the number of intervening sections or loops. In practice, however, the network is loaded by the internal impedances of the signal sources working into the several junctions so that the magnitude of the output-voltage increment attributable to a given source varies with the number of simultaneously operative sources.

It is, therefore, the general object of our present invention to provide improved current-supply means for a load of the type set forth, designed to make the contribution of each input signal to an output signal substantially independent of the number of such signals simultaneously supplied.

A more particular object is to provide a decoding system as described above whose analog output is the true equivalent of the binary word fed in.

In accordance with the present invention, we provide a current supply comprising three transistors perferably of like conductivity type (e.g. NPN), i.e. a main transistor and two ancillary transistors in tandem therewith, these ancillary transistors being inserted in respective parallel branches of the output circuit of the main transistor. The first ancillary transistor works into a load impedance, e.g. into a junction of an R/2R network as described above, while the second ancillary transistor is in series with a dummy load of the same magnitude as the actual load impedance. Depending on the value of the binary input signal and its complement respectively applied to the control electrodes (bases) of the two ancillary transistors, one or the other of them is always conductive so that the same output current flows through either the actual load impedance or the dummy load.

Thus, the several input stages of such a system always draw the same current, regardless of the number of true bits, so that the operating voltage for the several transistors will not be affected by the number of energized network junctions. By a suitable choice of these operating voltages and the system parameters, the internal resistance of each input stage is made high in comparison with the resistance of the series and shunt arms of the weighting network so that this network is not appreciably loaded by the operative energizing circuits connected thereto.

Advantageously, in accordance with a further feature of our invention, the transistors of all energizing circuits are closely juxtaposed in a common environment so that their characteristics are uniformly affected by changes in ambient temperature or other environmental factors.

The above and other features of our invention will be described in detail hereinafter with reference to the accompanying drawing in which.

Figure 1:
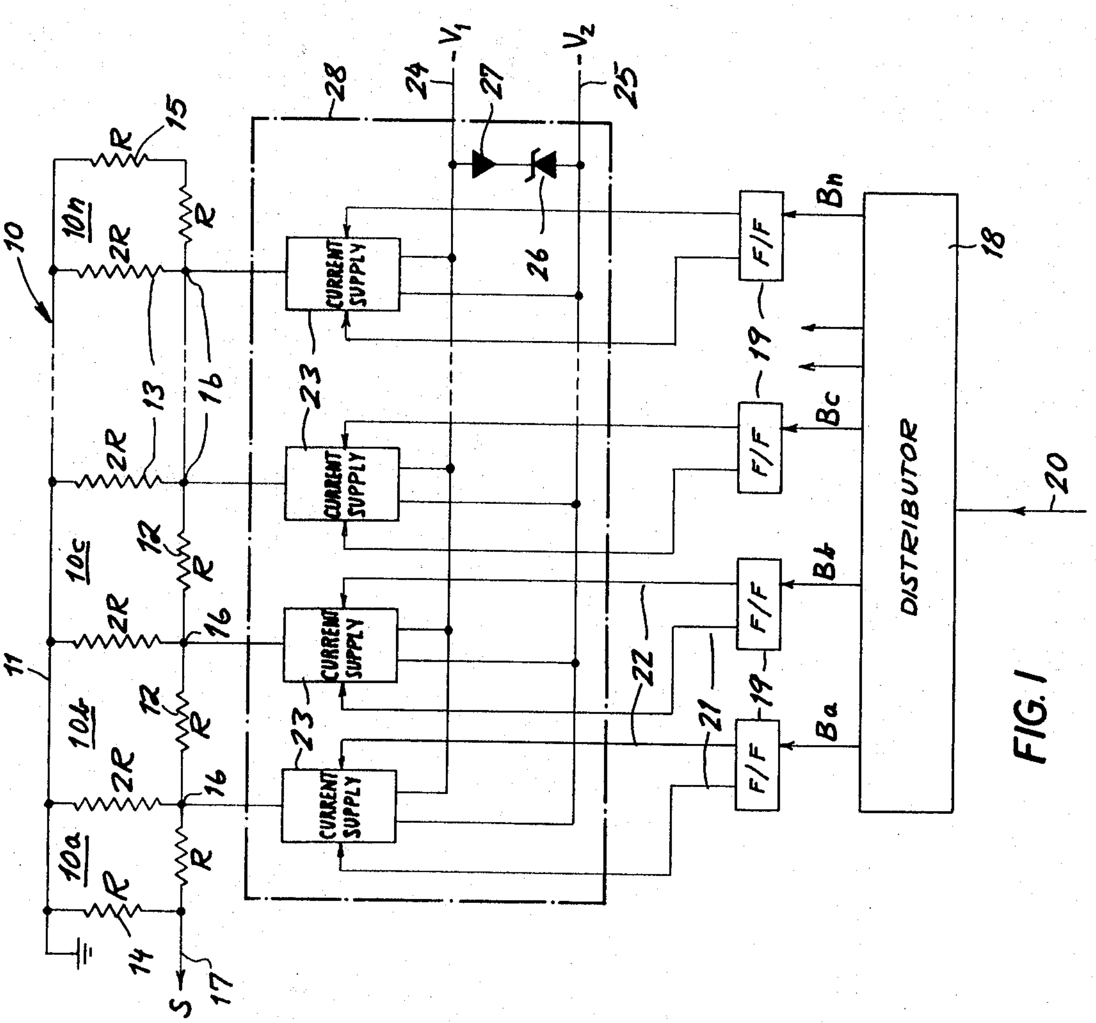
FIG. 1 is a block diagram of a system embodying our invention.

As shown in FIG. 1, a ladder-type weighting network 10 known per se comprises a grounded bus bar 11, a plurality of resistive series arms 12 of magnitude R, a plurality of resistive shunt arms 13 of magnitude 2R and two terminal resistors 14, 15 of magnitude R, these arms defining a number of loops or ladder sections 10*a*, 10*b*, 10*c*, . . . 10*n* separated by junctions or nodes 16. Section 10*a* has an output lead 17 carrying an analog signal S to be synthesized from bits B*a*, B*b*, B*c*, . . . B*n* delivered by a distributor 18 in parallel to several flip-flops 19, forming part of a switching circuit, in response to a digital pulse train arriving over a transmission path 20. Each flip-flop has a normally energized lead 21, carrying its reset output $V_i$, and a conjugate lead 22 carrying its set output $V_i$. The pairs of leads 21 and 22 terminate at respective current-supply circuits 23, one for each junction 16, to which operating voltages $-V_1$ and $-V_2$ are fed via common bus bars 24 and 25. These voltages are stabilized by a Zener diode 26 in series with a forwardly connected diode 27, the absolute magnitude of voltage $-V_2$ exceeding that of voltage $-V_1$ so that bus bar 24 is more positive than bus bar 25.

Figure 2:
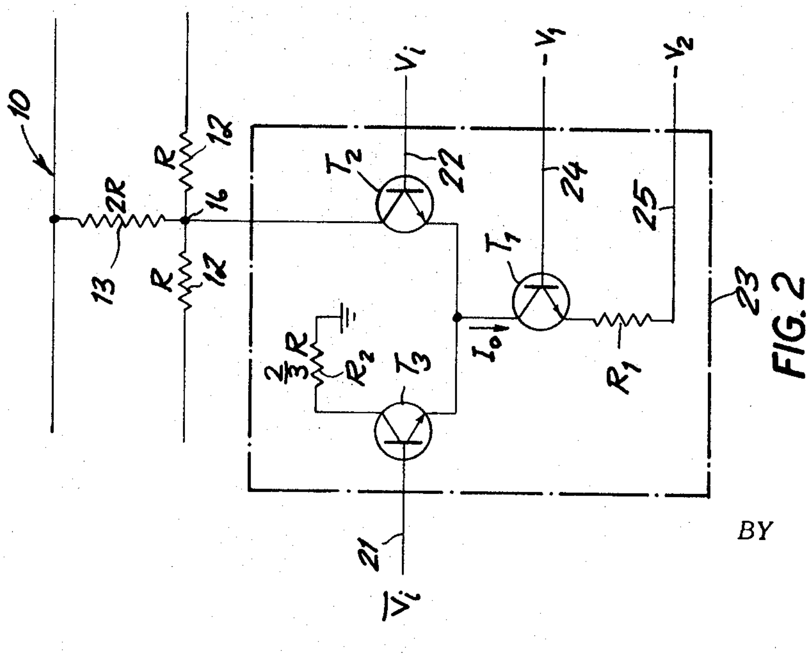
FIG. 2 is a more detailed diagram of the circuitry of an input stage of the system shown in FIG. 1.

Reference will now be made to FIG. 2 for a description of a current supply 23 representative of any of the input stages so designated in FIG. 1. This circuit comprises a main transistor $T_1$ with a base connected to bus bar 24, an emitter connected via a resistor $R_1$ to bus bar 25 and a collector connected in parallel to the emitters of two ancillary transistors $T_2$ and $T_3$, all these transistors being here shown as of the NPN conductivity type. The collector of transistor $T_2$, whose base is connected to the output lead 22 of the associated flip-flop 19 not shown in FIG. 2, is tied to the corresponding junction 16 of weighting network 10 whose resistance, as seen from circuit 23, equals 2R/3 for any of these junctions. A dummy resistance $R_2$ of the same magnitude is connected to the collector of transistor $T_3$ whose base is joined to the output lead 21 of the flip-flop. Transistor $T_1$ is continuously conductive.

In a typical case, the resistance R may equal 450 ω so that $R_2 = 300$ ω; with the voltage difference $V_2 - V_1$ chosen to maintain the emitter-collector voltage of transistor $T_1$ equal to, say, 80 Kω, the impedance of circuit 23 as seen from network 10 is very high even during saturation of transistor $T_2$, i.e. when the corresponding bit has the binary value "1." If that value is "0," transistor $T_2$ is cut off while transistor $T_3$ is saturated, yet the magnitude of the supply current $I_0$ drawn by the main transistor $T_1$ does not change. Thus, with transistor $T_1$ operating well below saturation, the magnitude of its emitter resistor $R_1$ may be small. Diode 27 serves as a low resistance designed to compensate, by its own response to changes in ambient temperature, thermal variations in the base/emitter voltage of any transistor $T_1$. As shown in FIG. 1, this diode as well as Zener diode 26 may be housed along with supply stages 23 in a common enclosure 28 providing a substantially identical climate for the several transistors. While temperature variations may still cause a drift in the absolute magnitude of output signal S, the relative values of the amplitude increments generated by the several bits B*a* – B*n* will not change.

We claim:

1. A system for converting a combination of binary input signals into an analog output, comprising:

a resistive ladder network with series and terminal resistances of magnitude R and with shunt resistances of magnitude 2R, said network forming a plurality of junctions between its series and shunt resistances;

an individual energizing circuit connected to each of said junctions, said energizing circuit including a main transistor, a first ancillary transistor between said main transistor and the corresponding junction, and a second ancillary transistor between said main transistor and a resistive dummy load of magnitude 2R/3 individual to each energizing circuit;

a constant-voltage source common to all energizing circuits for maintaining said main transistors thereof conductive with an internal resistance which is high compared to R; and switch means for alternately driving one ancillary transistor of each energizing circuit to conduction while simultaneously cutting off the other ancillary transistor thereof in response to changes in the binary value of a respective input signal, said network being provided with an output lead at a point common to one of said terminal resistances and an outgoing series resistance for generation of an analog signal synthesized from all input signals as weighted by said network.

2. A system as defined in claim 1 wherein said main and ancillary transistors are of like conductivity type and are each provided with a base, an emitter and a collector, the collector of said main transistor being connected in parallel to the emitters of said switching transistors.

3. A system as defined in claim 2 wherein said switch means comprises a first base lead for said first ancillary transistor carrying said input signal and a second base lead for said second ancillary transistor carrying the complement of said input signal.

4. A system as defined in claim 1 wherein the transistors of all said energizing circuits are closely juxtaposed in a common environment.

* * * * *